(12) United States Patent
Yang et al.

(10) Patent No.: US 9,159,435 B2
(45) Date of Patent: Oct. 13, 2015

(54) SEMICONDUCTOR MEMORY DEVICE HAVING BOUNCING DETECTION CIRCUIT AND METHOD OF OPERATING THE SAME

(75) Inventors: Chang Won Yang, Gyeonggi-do (KR); Hwang Huh, Chungcheongbuk-do (KR); Myung Jin Park, Seoul (KR); Chang Hyuk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 540 days.

(21) Appl. No.: 13/600,541

(22) Filed: Aug. 31, 2012

(65) Prior Publication Data

US 2013/0163343 A1 Jun. 27, 2013

(30) Foreign Application Priority Data

Dec. 22, 2011 (KR) .......................... 10-2011-0140196

(51) Int. Cl.
*G11C 16/26* (2006.01)

(52) U.S. Cl.
CPC ....................................... *G11C 16/26* (2013.01)

(58) Field of Classification Search
CPC ........... G11C 11/1677; G11C 11/2277; G11C 13/0064; G11C 2211/5621; G11C 2211/5624; G11C 16/26
USPC ........................................ 365/185.21, 185.22
See application file for complete search history.

(56) References Cited

U.S. PATENT DOCUMENTS

| 6,031,760 A * | 2/2000 | Sakui et al. ............... 365/185.21 |
| 2003/0016562 A1* | 1/2003 | Im ............................. 365/189.02 |
| 2008/0298133 A1* | 12/2008 | Kim et al. ................ 365/185.22 |
| 2009/0003076 A1* | 1/2009 | Yun .......................... 365/185.21 |
| 2009/0003077 A1* | 1/2009 | Lim ......................... 365/185.21 |
| 2009/0168514 A1* | 7/2009 | Maejima et al. ......... 365/185.03 |
| 2009/0237992 A1* | 9/2009 | Maejima .................. 365/185.03 |
| 2012/0127802 A1* | 5/2012 | Choi ........................ 365/185.22 |

FOREIGN PATENT DOCUMENTS

| KR | 1020090000339 | 1/2009 |
| KR | 1020100091413 | 8/2010 |
| KR | 1020100133617 | 12/2010 |

* cited by examiner

*Primary Examiner* — Vanthu Nguyen
*Assistant Examiner* — Khamdan Alrobaie
(74) *Attorney, Agent, or Firm* — IP & T Group LLP (57) ABSTRACT

The semiconductor memory device includes a memory cell array that includes a plurality of cell strings coupled between a common source line and a plurality of bit lines, a peripheral circuit that reads data stored in a selected memory cell, a bouncing detection circuit that compares a voltage supplied to the common source line and a reference voltage to thereby output a detection signal while performing a reading operation, and a control circuit that controls the peripheral circuit in order to perform the reading operation by adjusting the number of sensing operation times in accordance with the detection signal.

14 Claims, 5 Drawing Sheets

SEMICONDUCTOR MEMORY DEVICE HAVING BOUNCING DETECTION CIRCUIT AND METHOD OF OPERATING THE SAME

CROSS-REFERENCE TO RELATED APPLICATION

This application claims priority to and the benefit of Korean Patent Application No. 10-2011-0140196, filed on Dec. 22, 2011, the disclosure of which is incorporated herein by reference in its entirety.

BACKGROUND

Embodiments of the present invention relate to a semiconductor memory device and a method of operating the same.

In a semiconductor memory device, the magnitude of a threshold voltage may be varied by adjusting an amount of charge that is supplied to a floating gate of a memory cell. Therefore, data in a variety of formats may be stored. In addition, the stored data may be read by sensing the threshold voltage of the memory cell.

As methods of sensing the threshold voltage of the memory cell, a voltage sensing method and a current sensing method are used.

In the current sensing method, when sensing the threshold voltage of the memory cell, a reference current that is input to the bit line senses the threshold voltage by verifying whether a bit line is precharged or not.

Therefore, whether a current flowing through the bit line and a cell string is leaked to a common source line (CSL) or not is important.

Meanwhile, in the common source line (CSL), source line bouncing may occur due to a structure in which a plurality of cell strings are coupled in common.

The source line bouncing refers to a phenomenon in which a large amount of current flows into the common source line (CSL) along the cell string coupled with the bit line while performing a reading operation, and thereby a voltage of the common source line (CSL) rises. When the voltage of the common source line (CSL) rises, the current flowing to the cell string may not be discharged sufficiently.

That is, the current may not be leaked into the common source line (CSL) through the cell string due to the source line bouncing, and thereby the threshold voltage of the memory cell may not be sensed normally.

SUMMARY OF THE INVENTION

Exemplary embodiments of the present invention relate to a semiconductor memory device that enables selective use of a multi-sensing method based on an occurrence of bouncing of a common source line, and a method of operating the same.

An exemplary embodiment of the present invention provides a semiconductor memory device that includes a memory cell array that includes a plurality of cell strings coupled between a common source line and a plurality of bit lines, a peripheral circuit that reads data stored in a selected memory cell, a bouncing detection circuit that compares a voltage supplied to the common source line and a reference voltage to thereby output a detection signal while performing a reading operation, and a control circuit that controls the peripheral circuit in order to perform the reading operation by adjusting the number of sensing operation times in accordance with the detection signal.

Another exemplary embodiment of the present invention provides a semiconductor memory device that includes a memory cell array including a plurality of cell strings where each cell string is coupled between a common source line and a plurality of bit lines, a page buffer group having a plurality of page buffers where each page buffer includes a sensing node coupled to each of the bit lines, a bouncing detection circuit that compares a voltage supplied to the common source line and a reference voltage and thereby outputs a detection signal, and a control circuit coupled to the page buffer group and the common source group for controlling multi-sensing operations of the page buffer according to a result of the detection signal.

A method of manufacturing a semiconductor device according to an exemplary embodiment of the present invention includes detecting whether a voltage of the common source line rises equal to or higher than a set voltage while performing a first sensing operation using a first reference current in order to sense a cell current flowing in a memory cell selected for data reading, omitting a first sensing data storage operation in accordance with the first sensing operation when the voltage of the common source line rises equal to or higher than the given voltage based on the detection result, and performing a second sensing operation using a second reference current less than the first reference current in order to sense the cell current flowing in the selected memory cell, and storing the second sensing data in accordance with the second sensing operation.

Another method of manufacturing a semiconductor device according to an exemplary embodiment of the present invention includes performing a first sensing operation by precharging the sensing node by providing a first reference current, detecting whether a voltage of the common source line rises equal to or higher than a first given voltage while performing the first sensing operation, omitting the first sensing data storage operation in accordance with the first sensing operation if the voltage of the common source line rises equal to or higher than the first given voltage based on the detection result, and performing a second sensing operation using a second reference current, and storing second sensing data from the second sensing operation.

DETAILED DESCRIPTION OF EMBODIMENTS

Hereinafter, various embodiments of the present disclosure will be described in detail with reference to the accompanying drawings. The figures are provided to enable those of ordinary skill in the art to make and use the present invention according to the exemplary embodiments of the present invention.

Figure 1:
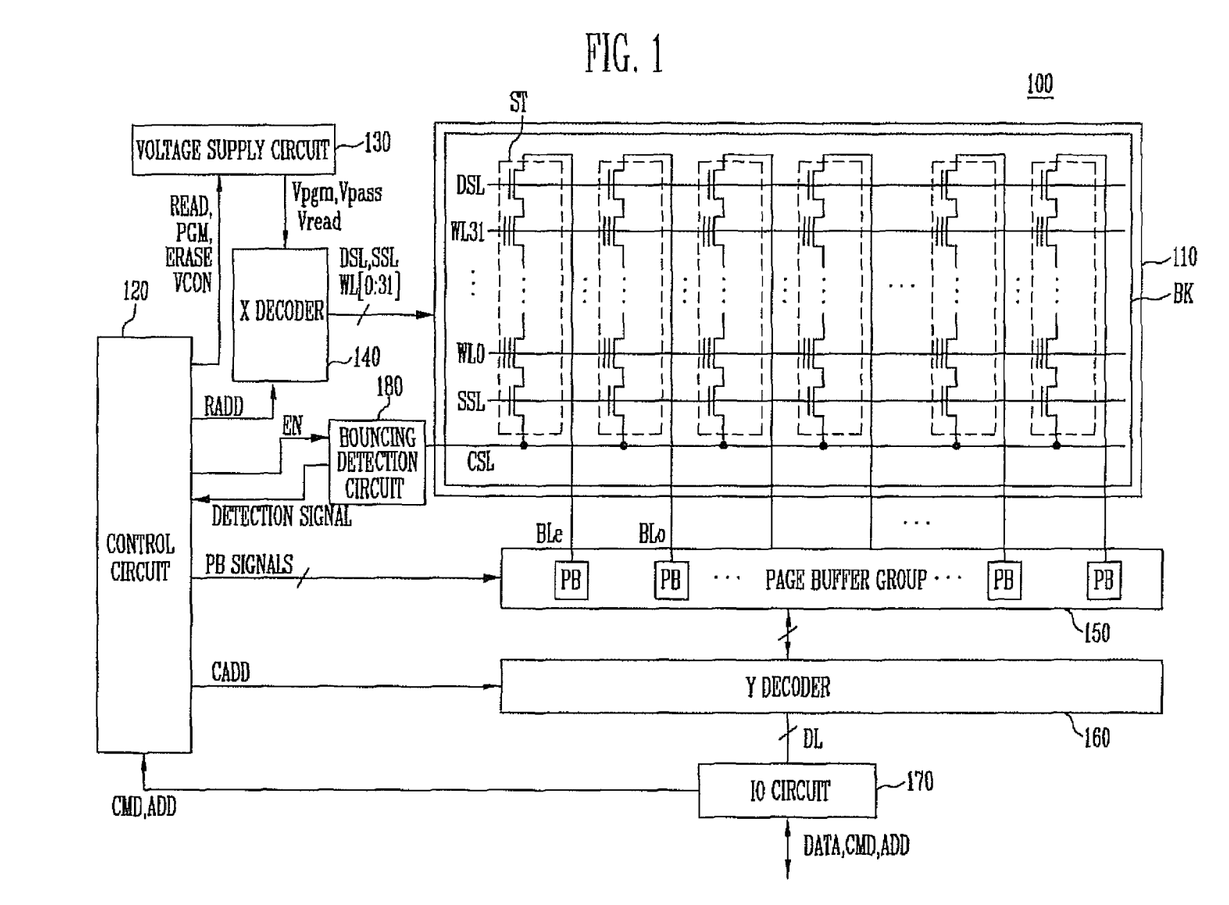
FIG. 1 is a drawing illustrating a semiconductor memory device according to an embodiment of the present invention.

FIG. 1 is a drawing illustrating a semiconductor memory device for describing the present invention.

Referring to FIG. 1, a semiconductor memory device 100 includes a memory cell array 110 including memory blocks (BKs) where a plurality of memory cells are coupled by bit lines and word lines.

In addition, the semiconductor memory device 100 includes peripheral circuit groups 130 to 170 for programming the memory cells or reading data stored in the memory cell, and a control circuit 120 for controlling the peripheral circuit groups 130 to 170.

In addition, the semiconductor memory device 100 includes a bouncing detection circuit 180 for detecting bouncing of a common source line (CSL).

The peripheral circuit groups 130 to 170 include a voltage supply circuit 130, an X decoder 140, a page buffer group 150, a Y decoder 160, and an input and output (IO) circuit 170.

The voltage supply circuit 130 may generate operation voltages for programming, reading, or erasing data in response to voltage control signals VCON and operation mode signals PGM, READ, and ERASE or the like from the control circuit 120, and may generate, for example, a program voltage Vpgm, a reading voltage Vread, or an erasing voltage Verase, or the like.

The operation voltages Vpgm, Vread, Verase, or the like generated by the voltage supply circuit 130 are supplied to the X decoder 140 through global word lines.

The X decoder 140 selects one of a plurality of memory blocks (BKs) in the memory cell array 110 based on a row address RADD input from the control circuit 120, and couples word lines and selection lines SSL, DSL, and WL0 to WL31 of the selected memory block BK with the global word lines, respectively, so that the operation voltage is transmitted.

The page buffer group 150 includes page buffers (PBs) which are coupled to each of pairs of an odd bit line BLo and an even bit line BLe among the bit lines. The page buffers PB are operated when programming, reading, or erasing data in response to page buffer control signals PB SIGNALS from the control circuit 120.

The memory cells of the memory block BK, and a connection between the word lines WL0 to WL31 and the bit lines BLe and BLo with the page buffer PB will be described below.

The Y decoder 160 provides a data input and output path between the IO circuit 170 and the page buffer group 150 in response to a column address CADD from the control circuit 120.

The IO circuit 170 transmits a command CMD, an address ADD, and data DATA, which are inputs to the semiconductor memory device 100, to the Y decoder 160 or the control circuit 120, or IO circuit 170 outputs the data transmitted through the Y decoder 160 to the outside.

The bouncing detection circuit 180 may detect an occurrence of bouncing in the common source line (CSL) when performing a data reading operation, and outputs the detection result as a detection signal.

The control circuit 120 outputs voltage control signals VCON for controlling operations of the peripheral circuit groups 130 to 170 based on the command CMD and the address ADD, which are transmitted from the IO circuit 170, the page buffer control signals PB SIGNALS, the column address CADD, the row address RADD, and the like. In addition, the control circuit 120 outputs an enable signal EN for enabling the bouncing detection circuit 180 at the time of a reading operation, and may control a reading operation of a multi-sensing method in accordance with the detection signal output by the bouncing detection circuit 180.

Figure 2:
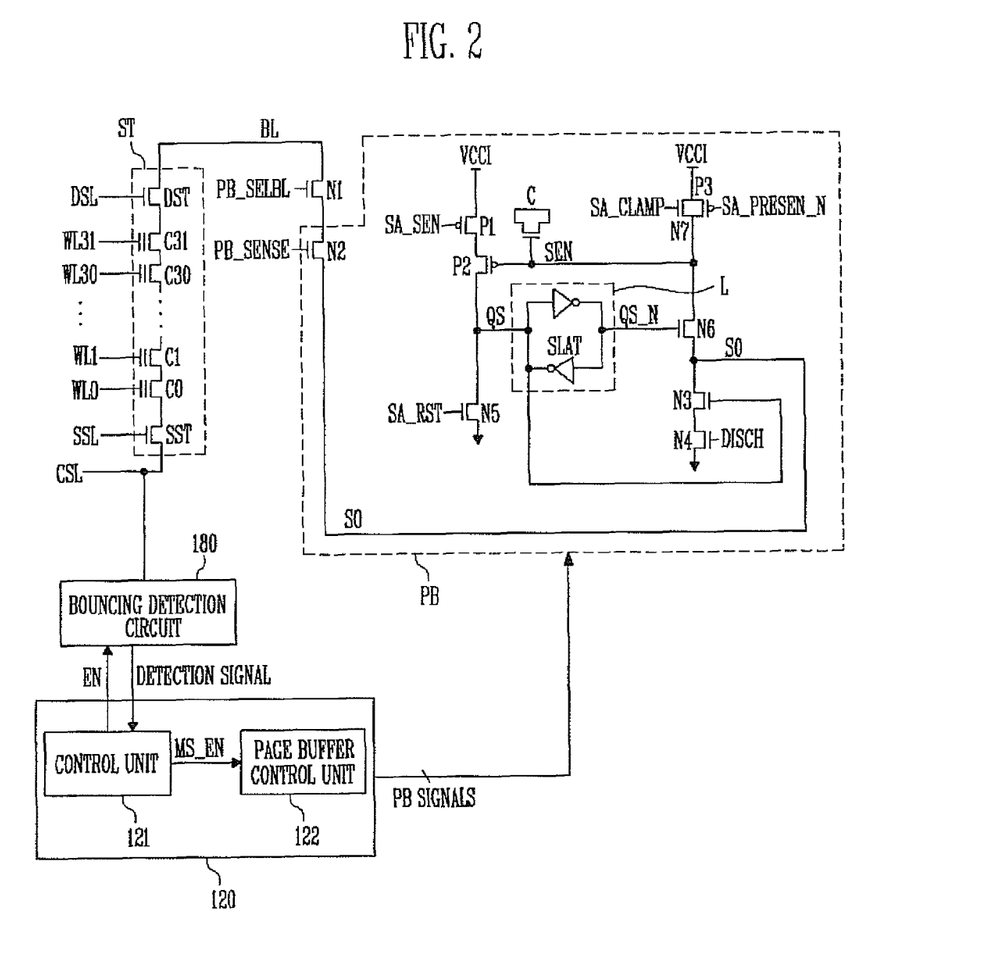
FIG. 2 is a drawing illustrating a connection between a cell string and a page buffer of FIG. 1.

FIG. 2 is a drawing illustrating a connection between a cell string and a page buffer of FIG. 1.

Referring to FIG. 2, a cell string ST includes zeroth to thirty-first memory cells C0 to C31 coupled in series between a drain selection transistor DST and a source selection transistor SST.

A drain selection line DSL is input to a gate of the drain selection transistor DST, and a drain of the drain selection transistor DST is coupled to a bit line (BL).

A source selection line SSL is input to a gate of the source selection transistor SST, and a source of the source selection transistor SST is coupled to the common source line CSL.

The zeroth to thirty-first word lines WL0 to WL31 are coupled to the gates of zeroth to thirty-first memory cells C0 to C31, respectively.

In addition, the common source line CSL is coupled to the bouncing detection circuit 180.

A first NMOS transistor N1 is coupled between the bit line BL and the page buffer PB. A bit line selection signal PB_SELBL is input to a gate of the first NMOS transistor N1.

The page buffer PB includes the second to seventh NMOS transistors N2 to N7, first to third PMOS transistors P1 to P3, a capacitor C, and a latch L.

The second NMOS transistor N2 is coupled between the first NMOS transistor N1 and a sensing node SO. A first sensing signal PB_SENSE is input to a gate of the second NMOS transistor N2.

The third and fourth NMOS transistors N3 and N4 are coupled in series between the sensing node SO and a ground node, a gate of the third NMOS transistor N3 is coupled to a node QS, and a discharge signal DISCH is input to a gate of the fourth NMOS transistor N4.

The fifth NMOS transistor N5 is coupled between the node QS and the ground node, and a reset signal SA_RST is input to a gate of the fifth NMOS transistor N5.

The latch L is coupled between the node QS and a node QS_N.

The first and second PMOS transistors P1 and P2 are coupled in series between a power supply voltage input terminal VCCI and the node QS. A second sensing signal SA_SEN is input to a gate of the first PMOS transistor P1 and a gate of the second PMOS transistor P2 is coupled to a node SEN.

The capacitor C is coupled to the node SEN. In addition, the sixth NMOS transistor N6 is coupled between the node SEN and the sensing node SO, and a gate of the sixth NMOS transistor N6 is coupled to the node QS_N.

The seventh NMOS transistor N7 and the third PMOS transistor P3 are coupled in common between the power supply voltage input terminal VCCI and the node SEN. A latch signal SA_CLAMP is input to a gate of the seventh NMOS transistor N7, and a precharge signal SA_PRESEN_N is input to a gate of the third PMOS transistor P3.

Meanwhile, the bouncing detection circuit 180 may detect an occurrence of bouncing of the common source line CSL, in response to the enable signal EN from the control circuit 120, and outputs the detection result as a detection signal.

The control circuit 120 includes a control unit 121 and a page buffer control unit 122. Here, the control unit 121 outputs control signals for controlling operations such as programming, reading, erasing, and the like, and the page buffer control unit 122 outputs page buffer control signals PB SIGNALS for a multi-sensing operation in accordance with multi-sensing enable signals MS_EN, which are output by the control unit 121.

First and second sensing signals PB_SENSE and SA_SEN), latch signals SA_CLAMP, reset signals SA_RST, discharge signals DISCH and precharge signals SA_PRESEN_N, and the like may be used as the page buffer control signals PB SIGNALS.

A threshold voltage of the memory cell selected by using the page buffer PB that has the above-described structure may be measured by using a voltage sensing method or a current sensing method, and as an example, a reading operation that use the current sensing method will be briefly described.

Figure 3:
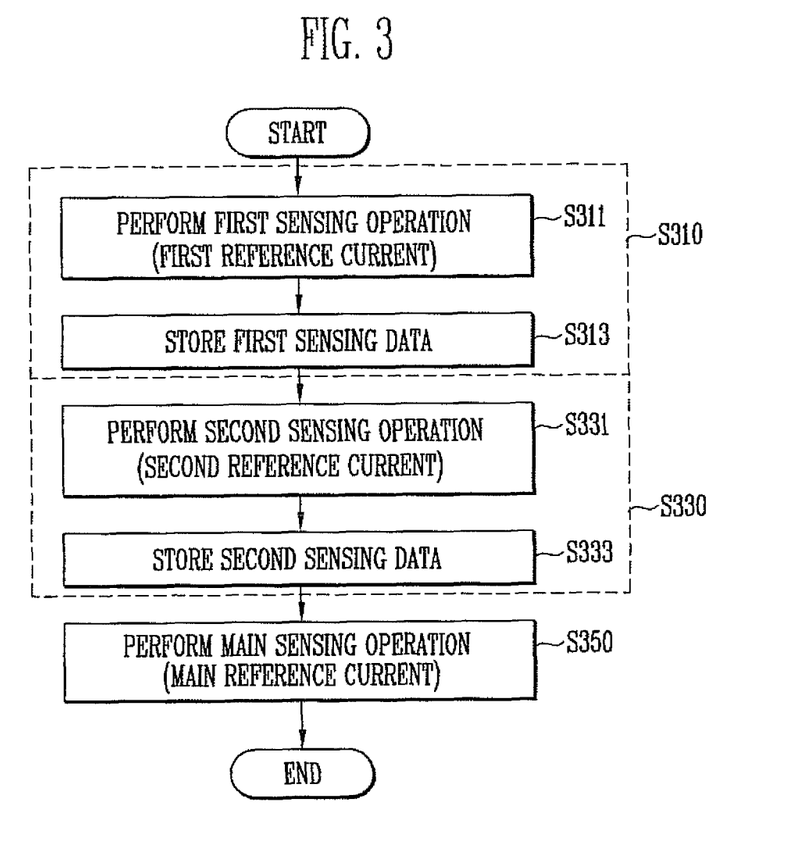
FIG. 3 is an operational flowchart for illustrating a data reading operation of a current sensing method.

FIG. 3 is an operational flowchart for describing a data reading operation in a current sensing method.

Referring to FIG. 3, when using the multi-sensing method during the reading operation, a first sensing operation in step S310, a second sensing operation in step S330, and a main sensing operation in step S350 are performed in the stated order.

In the first sensing operation of step S310, a first reference current is used.

That is, if a node QS of a latch L is reset to a low level, a bit line is precharged and sensed by using a first reference current in step S311, and first sensing data in accordance with a bit line voltage is stored in the latch L in step S313.

When a current greater than the first reference current flows in the selected memory cell, the bit line is not precharged, and when a current less than the first reference current flows in the selected memory cell, the bit line is precharged. In this instance, a reading voltage Vread is supplied to a word line to which the selected memory cell is connected, and a pass voltage Vpass is supplied to the remaining word lines.

When the bit line is precharged, the node QS of the latch L is kept at a low level, and when the bit line is not precharged, the node QS of the latch L switches to a high level.

When the node QS of the latch L switches to the high level, a corresponding page buffer PB is excluded during the subsequent sensing operation. This is because a node QS_N is changed to a low level when the node QS is at the high level, and thereby the sixth NMOS transistor N6 is turned off.

If the sixth NMOS transistor N6 is turned off, connection between a sensing node SO and a node SEN is blocked, and therefore an operation for performing precharge by providing the reference current to the bit line is impossible. In addition, the bit line is discharged to 0 V.

Meanwhile, if the bit line is in a precharged state because the current flowing in the selected memory cell is less than the first reference current, the second sensing operation is performed in step S330.

That is, the second sensing operation, which provides a second reference current to the bit line and verifies whether the bit line is precharged, is performed in step S331, and second sensing data in accordance with the bit line voltage is stored in step S333.

Because a result determined by the second sensing operation is similar to the result of the first sensing operation, description thereof will be omitted.

Meanwhile, when the bit line is precharged during the second sensing operation, that is, when the current flowing in the memory cell is less than the second reference current, the main sensing operation is performed in step S350.

In the main sensing operation, a main reference current that is actually used when reading data is used. The first and second reference currents use currents greater than the main reference current.

Because the main sensing operation is performed by selecting only a case in which a sensing operation is performed using the first and second reference currents and a current less than the second reference current flows in the memory cell, more accurate data sensing is possible compared to a case in which only the main sensing operation is performed once.

The main sensing operation in step 350 is similar to the first or second sensing operation, with the only difference that the reference current is used as the main reference current. The main reference current is a current that is used for actually reading data, and a sensed result using the main reference current is determined as reading data.

Multi-sensing is one of the reading methods that are used for increasing accuracy of the sensing operation by performing the sensing operation that use the first and second reference currents before performing the sensing operation that use the main reference current only once.

As a result, when performing the multi-sensing as shown in FIG. 3, the data reading may be performed more accurately than when performing the sensing operation only once.

However, current sensing is not normally performed when source line bouncing occurs, and therefore, only time required for performing the multi-sensing may be consumed, and effects of the data reading may be significantly reduced.

Therefore, according to an embodiment of the present invention, the source line bouncing is detected by the bouncing detection circuit 180 to control the multi-sensing operation, thereby reducing an unnecessary sensing time.

Figure 4:
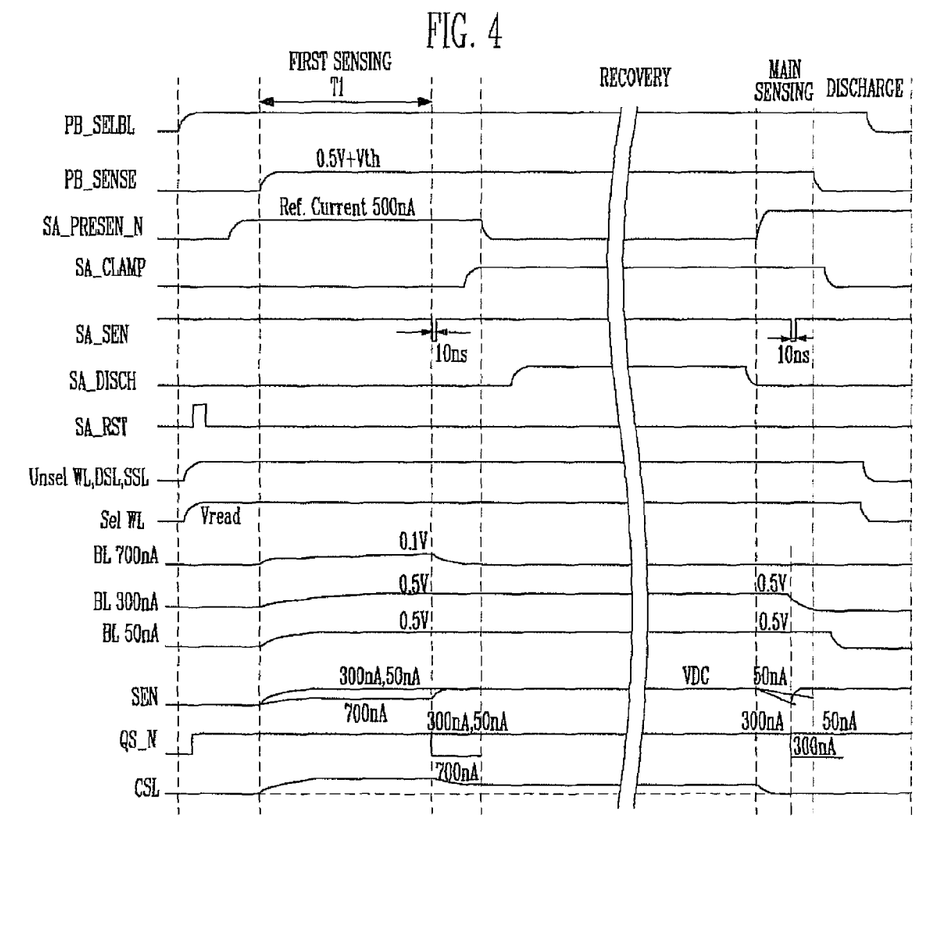
FIG. 4 is an operational timing diagram for describing a multi-sensing method according to an embodiment of the present invention.
Figure 5:
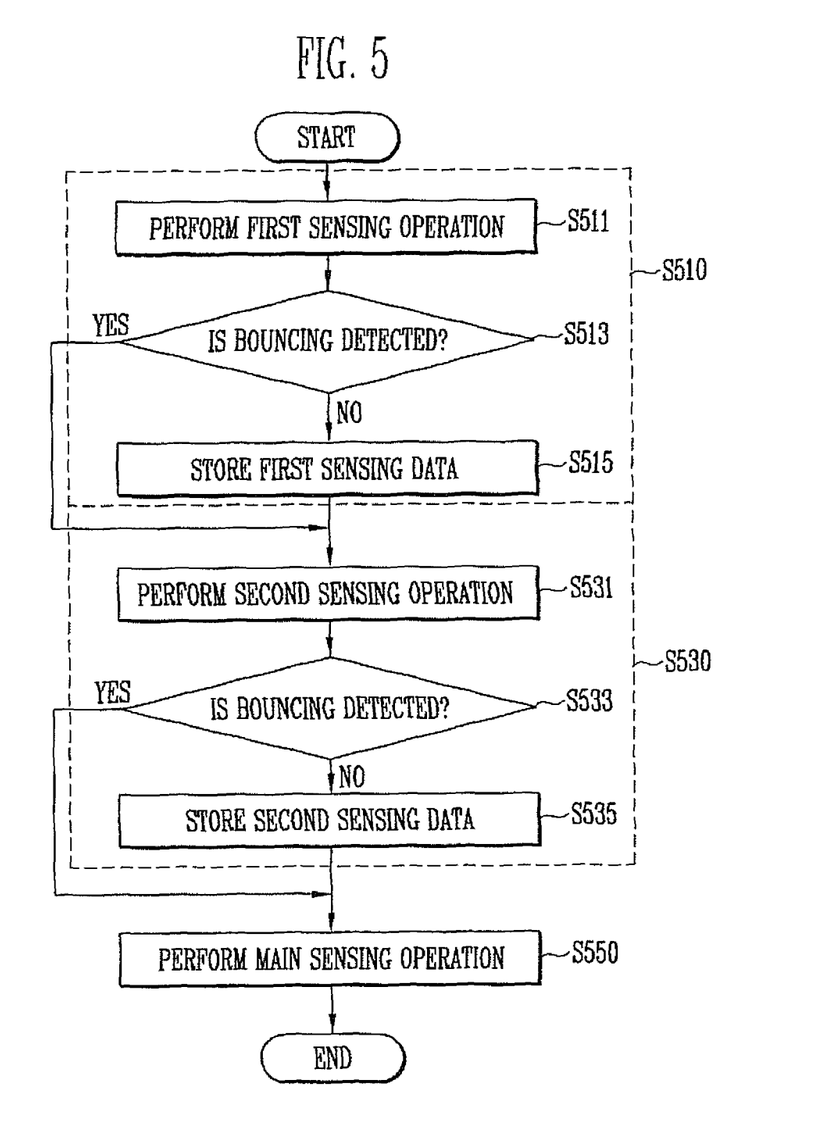
FIG. 5 is a flowchart for describing a multi-sensing method according to an embodiment of the present invention.

FIG. 4 is an operational timing diagram for describing a multi-sensing method according to the embodiment of the present invention, and FIG. 5 is a flowchart for describing a multi-sensing method according to the embodiment of the present invention.

FIG. 2 will be referred to when describing a multi-sensing method according to the exemplary embodiment of the present invention with reference to FIGS. 4 and 5.

Referring to FIG. 5, when using the multi-sensing method during the reading operation, a first sensing operation in step S510, a second sensing operation in step S530, and a main sensing operation in step S550 are performed in the stated order.

Referring to FIGS. 2, 4 and 5, a first sensing operation of the multi-sensing operation is performed in step S510. For this, a latch L of a page buffer BP is first reset. For this, the page buffer control unit 122 applies a reset signal SA_RST as a high level. In this instance, bit line selection signals BL_SELBL and second sensing signals SA_SEN are at a high level, and precharge signals SA_PRESEN_N, latch signals SA_CLAMP, and first sensing signals PB_SENSE are at a low level.

In addition, a high level is applied even to a drain selection line DSL and a source selection line SSL, a pass voltage Vpass is supplied to unselected word lines Unsel WLs, and a reading voltage Vread is supplied to selected word line Sel WLs.

If the reset signal SA_RST is at a high level, the fifth NMOS transistor N5 is turned on, and the node QS switches to a low level. In addition, because the node QS_N switches to a high level, the sixth NMOS transistor N6 is turned on.

Because the precharge signal SA_PRESEN_N is at a low level, the third PMOS transistor P3 is turned on, and thereby a power supply voltage VCCI is applied to the node SEN. In this instance, since the sixth NMOS transistor N6 is turned on, the power supply voltage VCCI is transmitted to the sensing node SO, and thereby the sensing node SO is precharged. A voltage that will be precharged to the sensing node SO is adjusted in accordance with a voltage level of the precharge signal SA_PRESEN_N.

According to the embodiment of the present invention, the first reference current is set as 500 nA when performing the first sensing operation, and the voltage in accordance with a case in which the current flows at 500 nA is precharged to the sensing node SO.

After the node QS is reset to a low level, the precharge signal SA_PRESEN_N is changed to a high level. Therefore, the node SEN is in a floating state.

In addition, the first sensing signal PB_SENSE is applied to a high level, and the first sensing operation is performed in step S511 so that the second NMOS transistor N2 is turned on, and the bit line BL and the sensing node SO are connected.

The voltage capable of being discharged when a current of 500 nA corresponding to the first reference current flows for a time (T1+a) longer than a first time (T1) is precharged to the sensing node SO.

When performing the first sensing operation, a reading voltage Vread is supplied to the selected word line Sel WL and a pass voltage Vpass is supplied to unselected word lines Unsel WL. In addition, a power supply voltage is supplied to a drain selection line DSL and a source selection line SSL, and the common source line CSL is coupled to a ground node.

Therefore, a cell current flows through a channel of the bit line and the cell string in accordance with a threshold voltage of the selected memory cell coupled to the selected word line Sel WL, and a voltage of the bit line is determined based on the magnitude of the cell current.

As above, it has been assumed that a voltage capable of being discharged to 0 V is precharged when the current of 500 nA flows for the time (T1+a) in the sensing node SO.

In addition, assuming that the magnitude of the cell current flowing through the bit line and cell string is 700 nA when the threshold voltage of the selected memory cell is lower than the read voltage Vread, most of the voltages are discharged and only the voltage of about 0.1 V is precharged to the bit line BL when the sensing node SO and the bit line BL are coupled for the first time (T1). In this instance, when the magnitude of the cell current is greater than 700 nA, a voltage less than 0.1 V may be precharged or discharged to 0 V.

When the cell current is 50 nA or 300 nA, which are less than 500 nA, a current less than the first reference current of 500 nA flows, and therefore the voltage of the bit line is precharged to 0.5 V or greater than 0 V.

The voltage precharged to the bit line is determined in accordance with the voltage precharged to the cell current and the sensing node SO.

A process of determining a change in the voltage of the bit line in accordance with the cell current corresponds to the first sensing operation of Step S511. In addition, the control unit 121 applies an enable signal EN to the bouncing detection circuit 180 while performing the first sensing operation, and thus, whether bouncing of the common source line CSL occurs or not may be detected.

The bouncing detection circuit 180 compares the reference voltage which is arbitrarily set and a voltage of the common source line CSL, and occurrence of the bouncing may be detected if the voltage of the common source line CSL is greater than the reference voltage. In addition, a detection signal based on the detection result is transmitted to the control unit 121.

The control unit 121 determines whether the bouncing occurs in accordance with the input detection signal in step S513, senses the voltage of the bit line BL, which is changed in accordance with the first sensing operation. If the bouncing does not occur, the control unit 121 sends a multi-sensing enable signal MS_EN to the page buffer control unit 122 to perform an operation for storing the sensed result in the latch L as first sensing data in step S515. The page buffer control unit 122 outputs page buffer signals PB SIGNALS to perform a first sensing data storage operation in accordance with the multi-sensing enable signal MS_EN. However, the control unit 121 outputs the multi-sensing enable signal MS_EN, which enables a data latch operation in accordance with the first sensing operation, which is not to be operated, when the occurrence of the bouncing is detected.

The first sensing data storage operation performed by the multi-sensing enable signal MS_EN is performed as follows.

First, a voltage of the bit line BL differs depending on the magnitude of the cell current. Referring to FIG. 4, the bit line voltage is 0.1 V when the cell current is 700 nA, and the bit line voltage is precharged to 0.5 V when the cell current is equal to or less than 300 nA.

In this instance, a latch signal SA_SEN may be changed to a low level for a short time, for example, 10 ns.

In this instance, since the node QS_N is at a high level, the sixth NMOS transistor N6 is turned on. In addition, the bit line selection signal PB_SELBL and the first sensing signal PB_SENSE are applied at a high level, and therefore, the first and second NMOS transistors N1 and N2 are turned on. Therefore, the bit line BL, the sensing node SO, and the node SEN are coupled with each other, and thereby have the same voltage level.

When the voltage of the bit line BL is 0.1 V, a voltage of the node SEN is also 0.1 V. In addition, when the bit line BL is 0.5 V, the voltage of the node SEN is also 0.5 V. In this instance, when considering the threshold voltages of the first, the second, and the sixth NMOS transistors N1, N2, and N6, the voltage of the node SEN becomes lower than that of the bit line BL.

In addition, it is assumed that the second PMOS transistor P2 is turned on when the voltage of the bit line is 0.1 V, and kept in a turned-off state when the voltage of the bit line BL is 0.5 V.

Based on the above-assumption, when the voltage of the bit line BL is 0.1 V, the second PMOS transistor P2 is turned on. In addition, when the latch signal SA_SEN) is at a low level, the first PMOS transistor P1 is turned on. Accordingly, the power supply voltage VCCI is supplied to the node QS through the second PMOS transistor P2.

When a power supply voltage is supplied to the node QS, the node QS_N is obviously changed to a low level, and the sixth NMOS transistor N6 is turned off.

The second PMOS transistor P2 is turned off when the voltage of the bit line BL is 0.5 V, and therefore the power supply voltage VCCI is not supplied to the node QS even though the latch signal SA_SEN is applied as a low level. Therefore, the node QS of the latch L is kept at a low level, the node QS_N is kept at a high level, and the sixth NMOS transistor N6 is kept turned on.

By the above-described process of storing the first sensing data, the node QS_N of the latch L of the page buffer PB, which is coupled to the bit line where the cell current flows with the magnitude greater than 700 nA, is changed to a low level to turn off the sixth NMOS transistor N6. The memory cell coupled to the bit line where the cell current flows with the magnitude greater than 700 nA has a threshold voltage lower than that of the reading voltage Vread. Therefore, the memory cell corresponding to this may be excluded from the subsequent second sensing operation or main sensing operation.

Meanwhile, because the cell current cannot flow normally if the occurrence of the bouncing is detected, a result of the first sensing operation may not be trusted. Accordingly, it is unnecessary to perform the first sensing data storing operation of step 515. In this manner, the first sensing data storage operation may be omitted, and an operation time is thereby reduced.

Meanwhile, after completing the first sensing operation of step S515, a recovery operation for repeatedly precharging the bit line (or sensing node SO) is performed for the second sensing operation.

For the recovery operation, the page buffer control unit 122 changes the precharge signal SA_PRESEN_N to a low level, and applies the latch signal SA_CLAMP at a high level. In addition, the discharge signal SA_DISCH is applied at a high level.

Therefore, the seventh NMOS transistor N7, the third PMOS transistor P3, and the fifth NMOS transistor N5 are turned on. In addition, when the first sensing data storage operation is performed in advance, the third NMOS transistor N3 of the page buffer PB where the node QS is changed to a high level is turned on.

However, based on the results of the first sensing data storage operation, when the node QS is kept at a low level without being changed to a high level or when the first sensing data storage operation is not performed, the third NMOS transistor N3 may not be turned on.

In the case of the page buffer PB where the third NMOS transistor N3 is turned on, the power supply voltage VCCI input to the node SEN is all discharged to the ground node. However, in a case of the page buffer PB where the third NMOS transistor N3 is turned off, the power supply voltage VCCI input to the node SEN is supplied to the bit line BL.

The page buffer PB where the third NMOS transistor N3 is turned off corresponds to a case in which the cell current flowing in the bit line coupled to a corresponding page buffer PB is 300 nA or 50 nA, a current of the corresponding bit line is precharged to 0.5 V in the first sensing operation of step S510, and is kept at 0.5 V in the above-described recovery operation as well.

After performing the recovery operation, the second sensing operation using the second reference current is performed in step S531. The second reference current may be set, for example, as 300 nA, so that the page buffer PB coupled to the bit line where the cell current flows at equal to or greater than 300 nA is excluded from the main sensing operation. In this instance, even when performing the second sensing operation, the bouncing detection circuit 180 detects bouncing of the common source line CSL, and outputs a detection signal in step S533.

In addition, the control unit 121 transmits the multi-sensing enable signal MS_EN to the page buffer control 122 in accordance with the detection signal, and the page buffer control unit 122 performs an operation for storing the second sensing data in response to the multi-sensing enable signal MS_EN in step S535. When the occurrence of the bouncing is detected, the second sensing data storage operation is omitted.

In addition, the main sensing operation is performed in step S550. For the main sensing operation, the main sensing operation and the sensing data storage operation are all performed without verifying whether the bouncing occurs.

If a main reference current applied is set at 50 nA when performing the main sensing operation, the node QS of the latch L of the page buffer PB, which is coupled to the bit line where the cell current is less than 50 nA is kept at a low level, and the node QS of the latch L of the page buffer PB, which is coupled to the bit line where the cell current is greater than 50 nA, is changed to a high level.

The data stored in the latch L by the main sensing operation becomes the data that is read from the memory cell by the reading voltage Vread.

The data reading method according to the exemplary embodiment of the present invention may reduce the whole reading time by omitting the storing of each piece of the sensing data in accordance with whether or not a bounce occurs when operating the multi-sensing.

As described above, according to the embodiments of the present invention, in a method of reading data, each of the sensing data storage operations is omitted depending on whether the bouncing occurs when performing the multi-sensing operation, thereby reducing the overall reading time.

According to another exemplary embodiment, when the bouncing occurs while performing the first sensing operation, a method of controlling so that the entire second sensing operation is entirely omitted, and the main sensing operation is directly performed may be applicable.

A semiconductor memory apparatus and a method for operating the same according to embodiments of the present invention can reduce a sensing time in application a multi-sensing method during reading of data by omitting an operation for storing a sensing result, when a multi-sensing result is not in demand for being stored based on the occurrence of bouncing in the common source line.

In the semiconductor memory device and the method of operating the same according to the embodiments of the present invention, when the multi-sensing method is applied during reading of data, the sensing result storage is omitted when the multi-sensing result is not required to be stored in accordance with an occurrence of bouncing of the common source line, thereby reducing a sensing time.

In the drawings and specification, there have been disclosed typical exemplary embodiments of the invention and, although specific terms are employed, they are used in a generic and descriptive sense only and not for purposes of limitation. The scope of the invention is to be set forth in the following claims. Therefore, it will be understood by those of ordinary skill in the art that various changes and modifications in form and details may be made therein without departing from the spirit and scope of the present invention as defined by the following claims.

What is claimed is:

1. A semiconductor memory device comprising:
    a memory cell array that includes a plurality of cell strings coupled between a common source line and a plurality of bit lines;
    a peripheral circuit that reads data stored in a selected memory cell;
    a bouncing detection circuit that compares a voltage supplied to the common source line and a reference voltage to thereby output a detection signal while performing a reading operation; and
    a control circuit that controls the peripheral circuit in order to perform the reading operation by adjusting a number of sensing operations in accordance with the detection signal,
    wherein, when the voltage supplied to the common source line is higher than the reference voltage, the control circuit controls the peripheral circuit in order to perform the reading operation by reducing the number of sensing operations.

2. The semiconductor memory device of claim 1, wherein, when the voltage supplied to the common source line is not higher than the reference voltage, the control circuit controls the peripheral circuit in order to perform a main reading operation.

3. A semiconductor memory device comprising:
    a memory cell array including a plurality of cell strings where each cell string is coupled between a common source line and a plurality of bit lines;

a page buffer group having a plurality of page buffers where each page buffer includes a sensing node coupled to all the bit lines;

a bouncing detection circuit that compares a voltage supplied to the common source line and a reference voltage and thereby outputs a detection signal; and a control circuit coupled to the page buffer group and the common source line for controlling multi-sensing operations of the page buffer according to a result of the detection signal, wherein, when the voltage supplied to the common source line is higher than the reference voltage, the control circuit controls the page buffer group in order to perform a reading operation by reducing a number of sensing operations.

4. The semiconductor memory device of claim 3, wherein each page buffer is configured to provide a current to the sensing node suitable for performing the multi-sensing operations.

5. A method of operating a semiconductor memory device including a memory cell array having a plurality of cell strings where each cell string is coupled between a common source line and a bit line, comprising:

detecting whether a voltage of the common source line rises equal to or higher than a given voltage while performing a first sensing operation using a first reference current in order to sense a cell current flowing in a memory cell selected for data reading;

omitting a first sensing data storage operation in accordance with the first sensing operation when the voltage of the common source line rises equal to or higher than the given voltage based on the detection result, and performing a second sensing operation using a second reference current less than the first reference current in order to sense the cell current flowing in the selected memory cell; and storing the second sensing data in accordance with the second sensing operation.

6. The method of claim 5, further comprising:
performing a recovery operation for precharging a bit line to which the selected cell memory is coupled before performing the second sensing operation.

7. The method of claim 5, further comprising:
performing the first sensing data storage operation in accordance with the first sensing operation when the voltage of the common source line does not rise equal to or higher than the given voltage.

8. The method of claim 7, wherein the second sensing operation is not performed with respect to a memory cell where the cell current is greater than the first reference current, in accordance with the first sensing data storage operation.

9. The method of claim 7, wherein data stored in accordance with the storing of the second sensing data is determined as reading data read from the selected memory cell.

10. The method of claim 5, further comprising:
performing a main reading operation for reading data of the selected memory cell after storing the second sensing data.

11. A method of operating a semiconductor memory device including a memory cell array having a plurality of cell strings where each cell string is coupled between a common source line and a bit line, and a page buffer having a sensing node coupled to the bit line, comprising:

performing a first sensing operation by precharging the sensing node by providing a first reference current;

detecting whether a voltage of the common source line rises equal to or higher than a first given voltage while performing the first sensing operation;

omitting the first sensing data storage operation in accordance with the first sensing operation if the voltage of the common source line rises equal to or higher than the first given voltage based on the detection result, and performing a second sensing operation using a second reference current; and storing second sensing data from the second sensing operation.

12. The method of claim 11, further comprising:
outputting the second sensing data as reading data.

13. The method of claim 12, further comprising:
using a second given voltage less than the first given voltage, in performing the second sensing operation.

14. The method of claim 13, further comprising:
performing a main reading operation for reading data of a selected memory cell after performing the second sensing operation.

* * * * *